US008837606B2

(12) United States Patent
Reves Balleste et al.

(10) Patent No.: US 8,837,606 B2
(45) Date of Patent: Sep. 16, 2014

(54) POWERLINE COMMUNICATION DEVICE NOISE TIMING BASED OPERATIONS

(75) Inventors: Xavier Reves Balleste, Barcelona (ES); Gerard Reves Vilaplana, Barcelona (ES); Jonathan Ephraim David Hurwitz, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 86 days.

(21) Appl. No.: 13/477,424

(22) Filed: May 22, 2012

(65) Prior Publication Data

US 2013/0003879 A1 Jan. 3, 2013

Related U.S. Application Data

(60) Provisional application No. 61/503,060, filed on Jun. 30, 2011.

(51) Int. Cl.
| | |
|---|---|
| *H04B 3/00* | (2006.01) |
| *H04L 25/02* | (2006.01) |
| *H03M 1/12* | (2006.01) |
| *H04W 36/14* | (2009.01) |
| *H04W 76/02* | (2009.01) |

(52) U.S. Cl.
CPC ............... *H03M 1/124* (2013.01); *H04L 25/02* (2013.01); *H04W 36/14* (2013.01); *H04W 76/026* (2013.01)
USPC ............................ 375/257; 375/222; 375/259

(58) Field of Classification Search
CPC .... H04L 25/02; H04W 36/14; H04W 76/026; H03M 1/124
USPC .......................................... 375/257, 222, 259
See application file for complete search history.

(56) References Cited

U.S. PATENT DOCUMENTS

| | | | | |
|---|---|---|---|---|
| 7,675,979 | B1 * | 3/2010 | Yu et al. .......................... | 375/259 |
| 8,072,323 | B2 * | 12/2011 | Kodama et al. ................ | 340/538 |
| 8,239,191 | B2 * | 8/2012 | Ehara et al. .................... | 704/219 |

* cited by examiner

*Primary Examiner* — Dhaval Patel
(74) *Attorney, Agent, or Firm* — Garlick & Markison; Bruce E. Garlick

(57) ABSTRACT

A Power Line Communications (PLC) device includes a processing module, memory, and a communication interface. The PLC device determines, at a PLC Physical Layer (PHY), a noise cycle of a power main coupled to the PLC interface. Based upon the noise cycle, the PLC device determines a higher noise period and a lower noise period of the noise cycle and then allocates, by a PLC Media Access Control (MAC) layer, first communication operations in the higher noise period and differing second communication operations in the lower noise period. Such operations may include adjusting framing of PLC MAC layer frames to have a first frame construct during the higher noise period and second frame construct during the lower noise period. Other differences in operations may be coding operations, either block or channel codes, QoS operations, restricting communications, redundant Acknowledgement (ACK) operations, or differing PLC standardized operations during the differing periods.

25 Claims, 16 Drawing Sheets

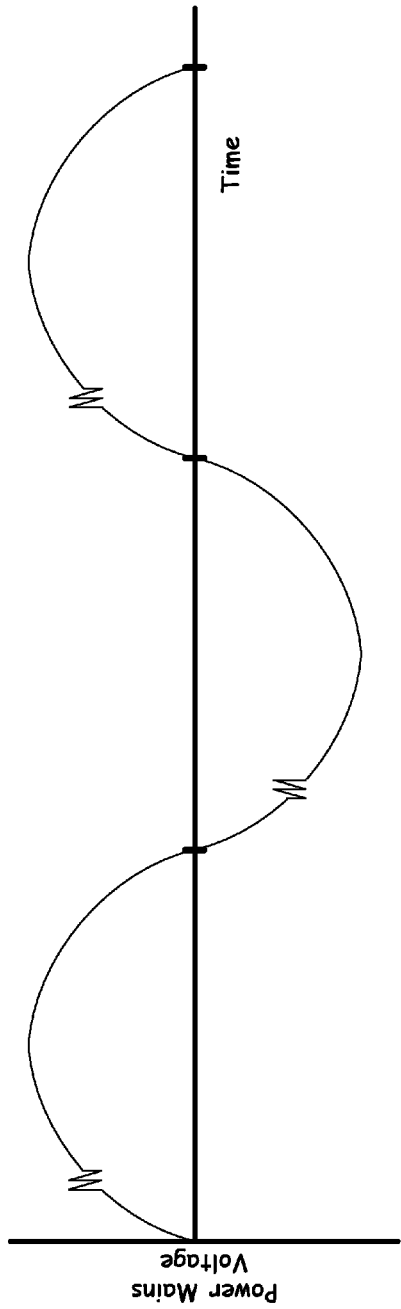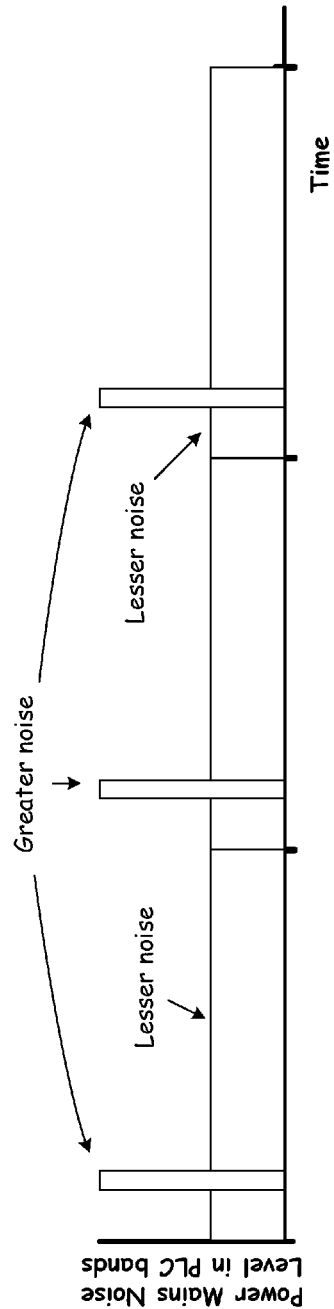
FIG. 5A
FIG. 5B

POWERLINE COMMUNICATION DEVICE NOISE TIMING BASED OPERATIONS

CROSS-REFERENCE TO PRIORITY APPLICATION

The present U.S. Utility Patent Application claims priority under 35 U.S.C. §119(e) to U.S. Provisional Application Ser. No. 61/503,060, entitled "Powerline Carrier Device and System," filed Jun. 30, 2011, which is hereby incorporated herein by reference in its entirety and made part of the present U.S. Utility Patent Application for all purposes.

BACKGROUND OF THE INVENTION

1. Field of the Invention

The present invention relates to powerline communications and in particular, powerline communication devices, and systems of use therefore.

2. Description of the Related Art

With the growing need for the exchange of digital content (e.g. MP3 audio, MPEG4 video and digital photographs) there is a widely recognized need to improve digital communication systems. Powerline communication (PLC) is a technology that encodes data in a signal and transmits the signal on existing electricity powerlines in a band of frequencies that are not used for supplying electricity. Accordingly, PLC leverages the ubiquity of existing electricity networks to provide extensive network coverage. Furthermore, since PLC enables data to be accessed from conventional power-outlets, no new wiring needs to be installed in a building (or different parts of a building). Accordingly, PLC offers the additional advantage of reduced installation costs.

Referring to FIG. 1, a household 100 typically has a distributed mains wiring system (not shown) consisting of one or more ring mains, several stubs and some distribution back to a junction box 112. In other constructs the distributed mains wiring system has a breaker box with circuits routed there from in a star configuration. For the sake of example, the household 100 has four rooms 104, 106, 108, and 120. Each room 104, 106, 108, and 120 may have a different number of outlets and other mains connections. For example, room 104 may have only one connection 122, room 106 may have two connections 124, 126, room 108 may have three connections 128, 130, 132 and room 120 may have six connections 134, 136, 138, 140, 142, 144.

Accordingly, there are a variety of distances and paths between different power outlets in the household 100. In particular, the outlets most closely located to each other are those on multi-plug strips, and the outlets furthest away from each other are those on the ends of stubs of different ring mains (e.g. power outlets in the garden shed and the attic). Communication between these furthest outlets typically passes through the junction box 112. Nonetheless, the majority of outlets associated with a particular application (e.g. Home Cinema) are normally located relatively close together.

Because the channel capacity of a powerline and connectors attenuates according to, amongst other features, the frequency of a transmitted signal, current generation PLC systems have been developed to transmit signals at relatively low frequencies (i.e. below 30 MHz) and thereby obtain suitable transmission distances. However, the use of such low transmission frequencies limits the maximum data throughput obtainable by PLC systems. Only recently have powerline systems extended beyond 30 MHz, which causes problems due to regulations that require lower injected power above 30 MHz. This requirement places additional demands on the dynamic range of transceivers servicing PLC communications in these higher frequency ranges.

The processes of receiving analog signals and injecting modulated signals are treated differently by different PLC communication standards. A number of powerline communication standards have been defined. These include the HomePlug 1.0/1.1 standards, the HomePlug AV standard, the CEPCA standard, the Digital Home Standard, IEEE 1901, and ITU-T G.9960. Current PLC approaches often include some analog conditioning to the signal-path (e.g., low-pass filtering for anti-aliasing or smoothing, or AC coupling to remove the low-frequency [<<1 KHz] high voltage content of the electricity mains). However, because differing PLC communication standards support differing communication bands, differing modulations, channel bandwidths, etc., PLC devices typically service only a single PLC communication standard. In common with most communication systems, one of the main problems with prior art PLC systems is obtaining high throughput and wide coverage at reasonable implementation cost, whilst maintaining compatibility with existing technologies. There is, therefore, a need for improved PLC systems that overcome the above and other problems.

Communications within the household 100 or within other premises may also be serviced by a Wireless Local Area Network (WLAN), a cellular network, millimeter wave communications, e.g., 60 GHz, Wireless Personal Area Network (WPAN), Cable Modem Network, Local Area Network (LAN), and other communication techniques. Each of these communication types has its respective benefits and shortcomings. None of these communication types is typically able to provide a full coverage solution within the household 100 (or other premises). The shortcoming of all wired technologies is the lack of mobility thereof. Shortcomings of all wireless technologies are coverage holes, which are typical, interference from other wireless devices, including competing wireless devices, Radar, etc., and bandwidth limitations.

BRIEF DESCRIPTION OF THE DRAWINGS

FIG. 5A is a graph illustrating a noise cycle of a power main upon which PLC constructed according to one or more embodiments of the present invention operates;

FIG. 5B is a graph showing noise levels of the noise cycle of FIG. 5A with which particular operations of embodiments of the present invention are described;

DETAILED DESCRIPTION

Figure 1:
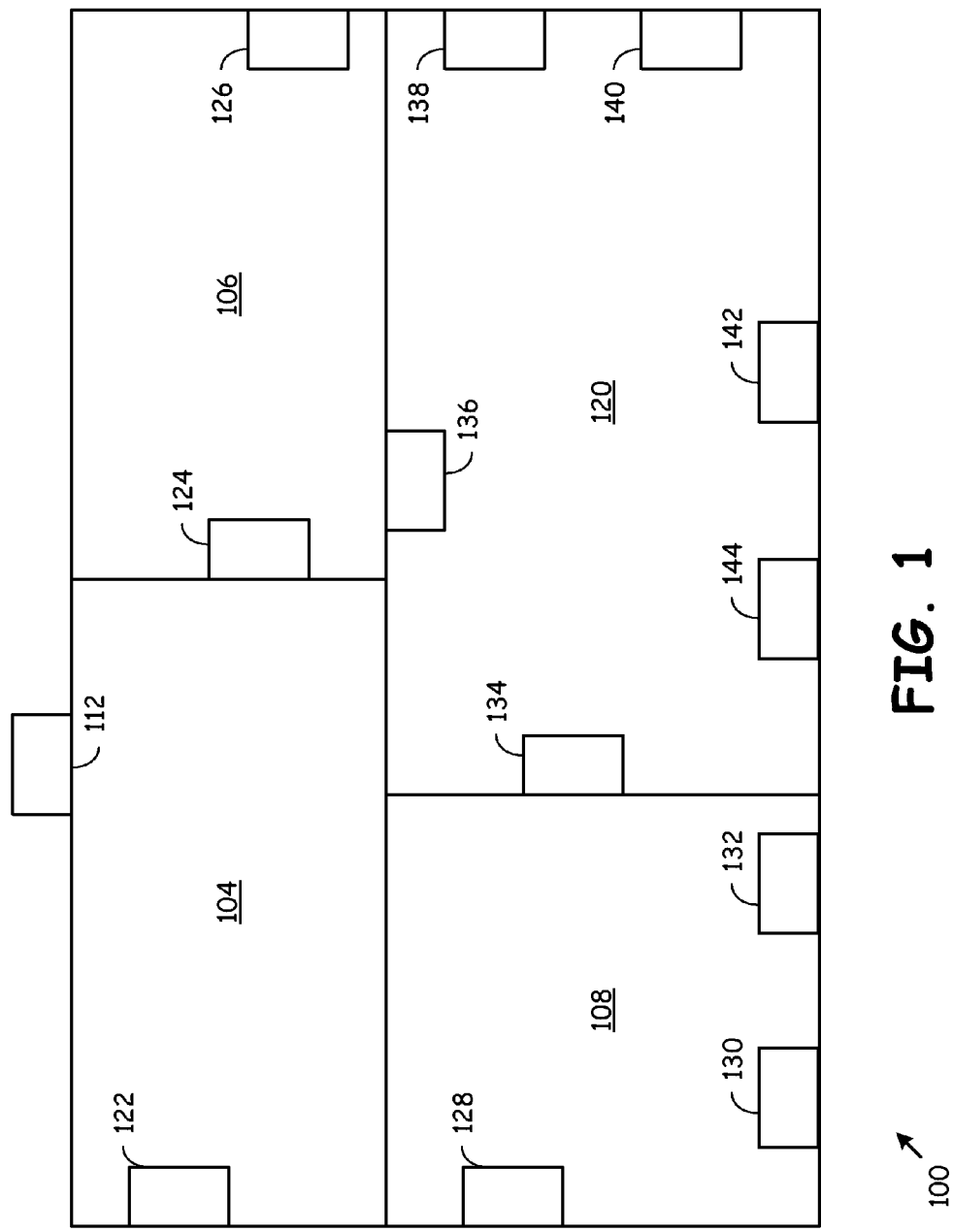
FIG. 1 is a block diagram illustrating a household having a plurality of power outlets.
Figure 2:
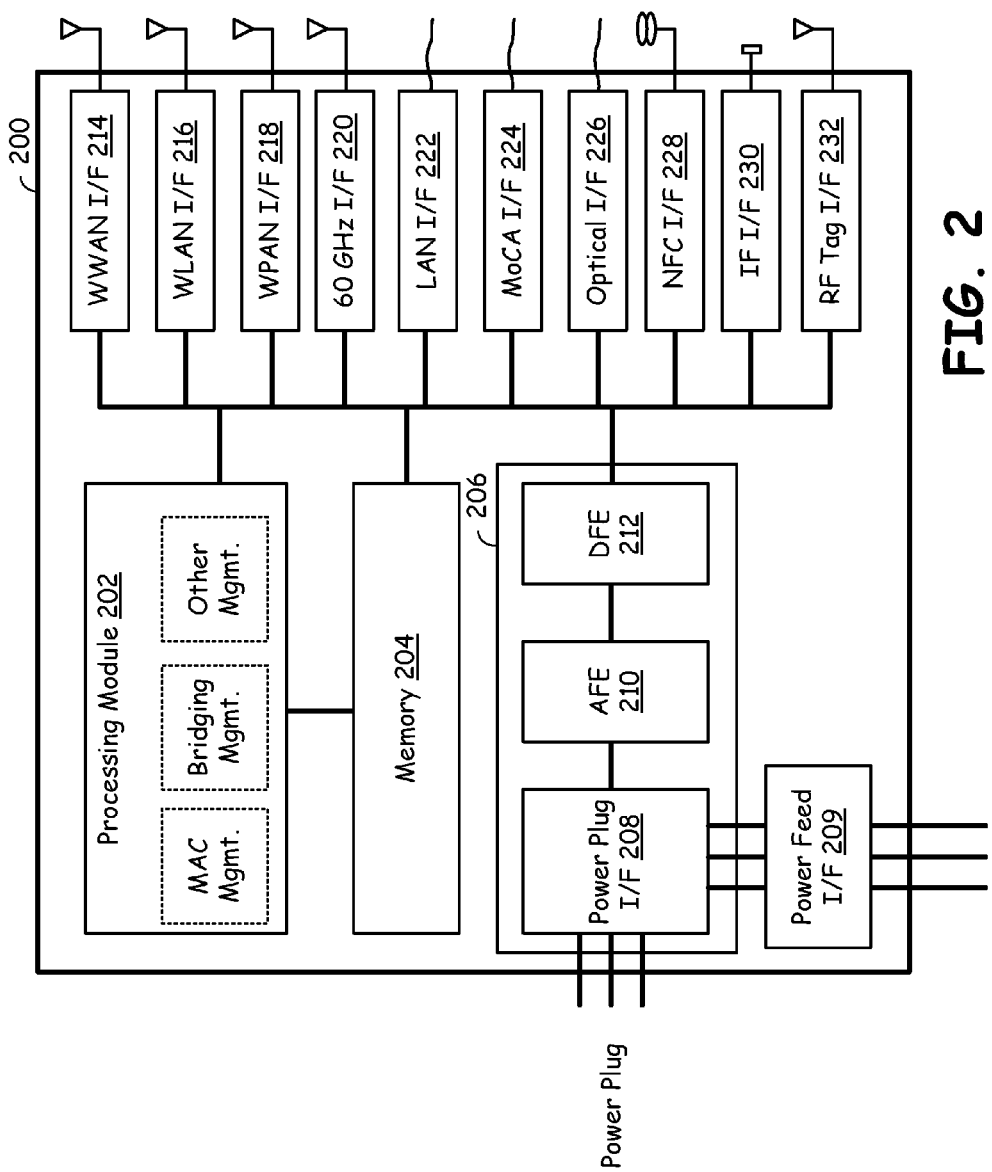
FIG. 2 is a block diagram illustrating a Powerline Communication (PLC) device constructed according to one or more embodiments of the present invention.

FIG. 2 is a block diagram illustrating a PLC device constructed according to one or more embodiments of the present invention. The PLC device 200 supports PLC operations according to one or more PLC communication standards. The PLC device 200 may be coupled to a power plug, e.g., into a wall plug. The PLC device 200 may further include a power feed I/F 209 to provide switchable power to a coupled load device, e.g., appliance. In some embodiments, the PLC device 200 may be permanently installed within a home or other premises.

The PLC device 200 includes a PLC interface 206 that includes a power plug interface 208, an Analog Front End (AFE) 210, and a Digital Front End (DFE) 212. Generally the AFE 210 includes analog signal processing elements while the DFE 212 includes digital signal processing elements. At least one Analog to Digital Converter (ADC) and at least one Digital to Analog Converter (DAC) service analog to digital and digital to analog signal conversion operations, respectively. Various components of the PLC interface 206 as they relate to embodiments of the present invention will be described further herein.

The PLC device 200 also includes one or more other communication interfaces, including a Wireless Wide Area Network (WWAN) interface 214, e.g., a WiMAX interface, a Wireless Local Area Network (WLAN) interface 216, e.g., an 802.11x interface, a Wireless Personal Area Network (WPAN) interface 218, e.g., a Bluetooth interface, a 60 GHz interface 220 (millimeter wave interface), a Local Area Network (LAN) interface 222, e.g., an Ethernet interface, a cable interface, e.g. Multimedia over Coax Alliance (MoCA) interface 224, an optical interface 226, a Near Field Communication (NFC) I/F 228, an Infra-Red I/F 230, and/or an RF Tag I/F 232. The user should appreciate that the PLC device 200 may bridge communications between a power plug and one or more devices, e.g., between the power plug and a desktop computer, a laptop computer, a touchpad computer, an appliance, a television, another entertainment system device, etc., via the PLC interface 206 and one or more of the other communication interfaces 214, 216, 218, 220, 222, 224, 226, 228, 230, and/or 232.

The processing module 202 may include one or more of a system processor, a digital signal processor, a processing module, dedicated hardware, an application specific integrated circuit (ASIC), or other circuitry that is capable of executing software instructions and for processing data. In particular, the processing module 202 is operable to support Medium Access Control (MAC) management, communications bridging management, and other management of the communications circuitry of the PLC device 200. The memory 204 may be RAM, ROM, FLASH RAM, FLASH ROM, optical memory, magnetic memory, or other types of memory that is capable of storing data and/or instructions and allowing processing circuitry to access same. The processing module 202 and the memory 204 supports operations of embodiments of the present invention as further described herein. These operations may be embodied in software instructions stored in the memory 204 and executed by the processing module 202.

According to one aspect of the present invention, in its operations, the processing module 202, in cooperation with the PLC I/F 206, and/or other components of the PLC device 200 determines, at a PLC Physical Layer (PHY), a noise cycle of a power main coupled to the PLC interface. The noise cycle and operations of the PLC device 200 based upon such noise levels will be described further herein with reference to FIGS. 5A-11. The processing module 202 then, based upon the noise cycle, determines a higher noise period and a lower noise period of the noise cycle. Finally, the processing module 202 allocates, by a PLC Media Access Control (MAC) layer, first communication operations in the higher noise period and differing second communication operations in the lower noise period.

The processing module 202 may be operable to adjust framing of PLC MAC layer frames to have a first frame construct during the higher noise period and second frame construct during the lower noise period, wherein the first frame construct differs from the second frame construct. In such case, the processing module 202 may enact first coding operations for the higher noise period and to enact second coding operations for the lower noise period. The differing coding operations may be one or both of block coding operations and channel coding operations.

The processing module 202 may be further operable to adjust framing of PLC MAC layer frames to have first quality of service support during the higher noise period and second quality of service support during the lower noise period, wherein the second quality of service support is greater than the first quality of service support. The processing module 202 may be further operable to restrict communications during the higher noise period, such that the data rate is limited during the higher noise period, differing modulation techniques are employed during the higher noise period, and/or different error recovery operations are enacted during the higher noise period.

According to another aspect of the present invention, the processing module 202 is operable to employ differing Acknowledgement (ACK) operations during the higher noise period than the ACK operations used during the lower noise period. In such case, ACK signals may be transmitted only on PLC media during low noise operations and over PLC media and non-PLC media during high noise operations.

According to yet another aspect of the present invention, the processing module 202 is operable to employ first communication operations in the higher noise period according to a first PLC communication standard and differing second communication operations during the lower noise period according to a second PLC communication standard that differs from the first communication standard. These and other operations according to embodiments of the present invention will be described further herein with reference to FIGS. 3-11.

Figure 3:
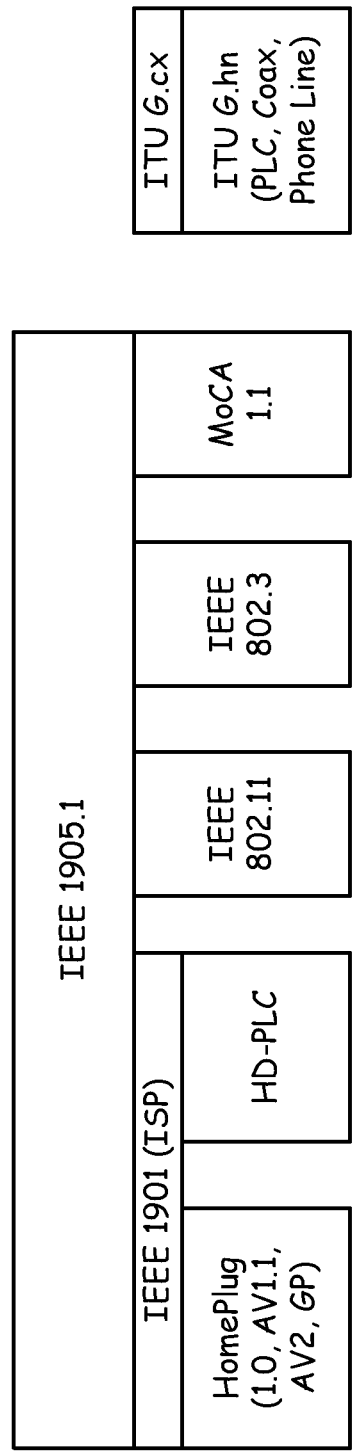
FIG. 3 is a block diagram illustrating various PLC (and other) communication standards that operate or are modified to operate according to one or more embodiments of the present invention.

FIG. 3 is a block diagram illustrating various PLC (and other) communication standards that operate or are modified to operate according to one or more embodiments of the present invention. Currently existing PLC communication standards include the HomePlug family of operations, including the 1.0, AV1.1, AV2, and GP operations, and the HD-PLC operations. Generally, the HomePlug family of PLC communication standards is incompatible with the HD-PLC communication standard. The HomePlug PLC communication standard is widely deployed while HD-PLC is primarily deployed in Japan.

The IEEE 1901 specification includes a newer PLC communication standard that has two different PHY layers, one based on OFDM modulation (interoperable with HomePlug AV1.1), and another based on Wavelet modulation (interoperable with HD-PLC). Each PHY layer is optional, and implementers of the communication standard may, but are not required to include both. Devices that use the OFDM PHY only would not interoperate with devices based on the Wavelet PHY. The OFDM PHY is derived from HomePlug AV.

The IEEE 1905.1 specification defines an abstraction layer for multiple home networking technologies. IEEE 1905.1 provides a common data and control Service Access Point to the heterogeneous home networking technologies described in the following specifications: IEEE 1901, IEEE 802.11x, IEEE 802.3x and Multimedia over Coax Alliance (MoCA) 1.1. The IEEE 1905.1 standard is extendable to work with other home networking technologies. The abstraction layer supports dynamic interface selection for transmission of packets arriving from any interface (upper protocol layers or underlying network technologies). End-to-end Quality of Service (QoS) is supported. Also specified are procedures, protocols and guidelines to provide a simplified user experience to add devices to the network, to set up encryption keys, to extend the network coverage, and to provide network management features to address issues related to neighbor discovery, topology discovery, path selection, QoS negotiation, and network control and management.

The IEEE 1905.1 layer resides between the media access control and Internet Protocol layers. The 1905.1 abstraction layer intends to make it easier to install and manage hybrid home networks and will also provide mechanisms for bridging data among different interfaces, i.e., plug and play.

ITU's G.hn specification is a competing counterpart to IEEE 1901 that primarily defines different ways to implement PHY and MAC layers of a PLC device. G.hn is a technology standard that enables service providers, consumer electronics companies, PC makers, and consumers to connect all types of devices via any wire in the home—coax cable, phone lines and powerlines.

There are a multitude of narrow and broadband PLC technologies beyond IEEE 1901 that already exist. For example, conventional tier two coexistence mechanisms are included in ISO/IEC 14908, G3 & G3 Lite, HP C&C, ISO/IEC 14543 which employ some form of CSMA/CA. Other PLC communication standard technologies do not support any type of coexistence other than tier one. Such standards include most current broadband PLC offerings, UPB, A10, INSTEON/X-10, Ariane Controls, CEBus, CEA 600.31, TDA 5051A, etc.

Each of these PLC communication standards has its own resistance to noise on the PLC media (power mains). Thus, according to one aspect of the present invention a first PLC communication standard may be enabled during the higher noise period and a differing second PLC communication standard during the lower noise period. The first PLC communication may be a relatively low data rate standard while the second PLC communication standard may be a relatively high data rate standard, which is less tolerant of noise on the PLC media. Further, various of the operations supported by these PLC communication standards may be modified according to embodiments of the present invention.

Figure 4:
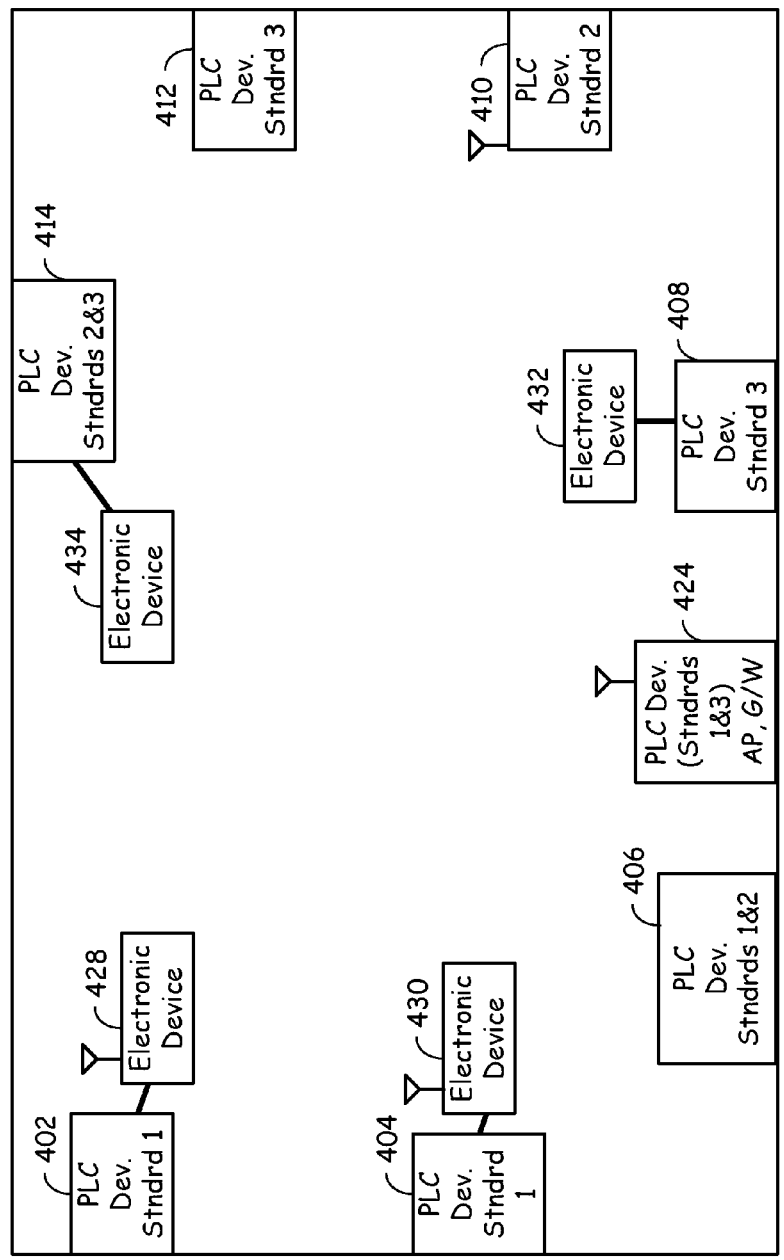
FIG. 4 is a system diagram illustrating a premises in which at least one PLC device resides that operates according to one or more embodiments of the present invention.

FIG. 4 is a block diagram illustrating a premises in which at least one PLC device resides that operates according to one or more embodiments of the present invention. The premises 400 may be a home, office building, apartment complex, hotel, industrial building, or another type of structure. In the particular example of FIG. 4, a WLAN access point 424 provides Internet access within the premises 400 and is also a PLC device constructed according to one or more embodiments of the present invention. Also shown within the premises 400 are a plurality of PLC devices 402, 404, 406, 408, 410, 412, and 414. One or more of these PLC devices 402, 404, 406, 408, 410, 412, and 414 may be provided by the premises 400 owner/operator while other of these PLC devices may be brought into the premises 400 by a customer. In particular, PLC device 402 services electronic device 428, PLC device 404 services device 430, PLC device 408 services electronic device 432, and PLC device 414 services electronic device 434. Each of these devices 428, 430, 432, and 434 may be owned by the premises 400 owner or may be owned by a premises 400 visitor.

According to one or more embodiments of the present invention, one or more of these PLC devices 402, 404, 406, 408, 410, 412, 414, and 424 supports one or more differing PLC communication standards. For example PLC device 402 supports PLC communication standard 1, PLC device 404 supports PLC communication standard 1, PLC device 406 supports PLC communication standards 1 and 2, PLC device 408 supports PLC communication standard 3, PLC device 410 supports PLC communication standard 3, PLC device 412 supports PLC communication standard 3, and PLC device 414 supports PLC communication standards 2 and 3, and PLC device 424 supports PLC communication standards 1 and 3. As will be further described herein the differing PLC communication standards may be wideband, narrowband, consistent with one another, and/or inconsistent with one another. These PLC communication standards may be one of the PLC communication standards described with reference to FIG. 3 or may be another PLC communication standard.

According to one or more embodiments of the present invention, one or more of the PLC devices 402, 404, 406, 408, 410, 412, 414, and 424 may serve as masters of the powerline media servicing the premises 400, may bridge communications across differing PLC communication standards, and/or may bridge communications between PLC communications and non-PLC communications. Several of these operations will be described herein subsequently. In some embodiments, each PLC standard will have a unique master, with differing PLC devices serving as masters for differing PLC communication standards. Likewise, each supported non-PLC communication standard may have its own master.

According to the embodiment of FIG. 4, during the relatively lower noise period, a first PLC communication standard may be employed and during a relatively higher noise period a second PLC communication standard may be employed that is somewhat more resistant to noise on the PLC media (power mains). In such case, two PLC devices that support two differing PLC communication standards may communicate with one another using differing PLC communication standards during differing portions of the noise cycle, such cycles predictable based upon the power mains cycle. Further, for non-cyclical noise events, one PLC standard may be the default PLC communication standard to which all PLC devices transfer upon detection of a noise event. One of the PLC devices, e.g., PLC device 424 may send out beacons when higher noise is detected. Upon receipt of the high noise beacon, all other PLC devices alter their configuration to support the more noise resistant PLC communication standard.

FIG. 5A is a graph illustrating the power mains voltage versus time. FIG. 5B is graph illustrating the noise on the power mains in the PLC band as a function of time. As is known, the quality of the sinusoidal voltage produced by rotating machinery of a utility company is very periodic and follows closely a sinusoidal function, as is intended. However, switching load within the home, office, etc., causes harmonic distortion, with peak magnitudes predictably within the 50 Hz or 60 Hz voltage frequency. These switching loads include fluorescent lighting, AC to DC power converters, and other loads. Powerline communication noise originates within a building (e.g., appliances and other ac powered devices, switches, lighting components, etc.), and outside thereof from neighboring building infrastructures as well as the power delivery infrastructure itself. Some noise is periodic and other is random. The noise introduced during the AC cycle is fairly predictable, occurring twice during each AC cycle. While this noise is predictable it is disruptive to PLC communications. FIG. 5A shows a sine wave at 50 Hz or 60 Hz with switching noise represented thereon. The reader should appreciate that this is a generalized representation only and that noise of this type takes various forms and magnitudes and may reside in various other portions of the cycle. Generally characterized in FIG. 5B are the temporal periods of greater noise, which corresponds to switching node off/on (or on/off) events, and temporal periods of lesser noise.

In conventional communication systems, communications that consider noise are managed by the PHY, not the MAC. A MAC framing structure typically involves an overall fixed frame length identified via a beacon signal transmitted by the controlling MAC device. Depending on channel access definitions, the MAC device manages communication exchanges (e.g., payload and ACKs) within such frames. According to one aspect of the present invention, a PLC device (constructed according to the present invention) PHY delivers noise information to the powerline MAC for MAC accommodation. Such noise information includes temporal periods of noise as well as noise characteristics. Such information may include noise event indications as well as repetitive noise pattern information. In response, the MAC adaptively perform one or more of: a) adjust framing or sub-framing around and/or through the noise; b) adjust and/or direct adjustment of (channel) coding during noisy frame portions; c) provide something like a sub-frame QoS arrangement favoring one area or another for more or less important data portions; d) restrict operation within a noisy sub-frame portion; etc.

One aspect of the present invention includes both frame timing adaptation (to orient the beginning of a frame after a noise event by sending a post event beacon) plus sub-frame delineation to define two communication periods wherein payload exchanges occur during the first sub-frame portion and associated acknowledgment occurs during the second sub-frame portion. If a noise event is excessive, the MAC enforces a dead zone during second sub-frame portion, else significantly changes ACK resilience.

The PHY to MAC noise information may include characterized repetitive noise (noise pattern information), and may also comprise real time noise event related information detected by the PHY such as noise onset detection, noise event end indication, noise intensity indications, etc. In one embodiment, a MAC only operates to address cyclical noise patterns, while in another it also addresses one time noise events through MAC adjustments.

These concepts may be extended according to the present invention to cover a time domain coexistence sharing strategy. A typical coexistence strategy may involve two entirely incompatible PLC device node groupings operating within a given premises. Current coexistence calls for a 50-50 TDMA split. However, some PLC technologies can operate much better in noisy situations than others, and, similarly some may operate better in a substantially noise free situations. Other factors such as legacy versus state of the art powerline groupings, user preferences, one group's size versus another, QoS per group, etc., may indicate a priority of one group over another.

According to another aspect of the present invention, instead of responding to noise patterns and events by sub-framing definition and adjustments as described above, the adjustments are extended to the realm of coexistence. That is, subjecting a less preferred or more noise resilient PLC node group operating pursuant to a first industry standard to periods in which noise is more common (or types of noise is more common) while permitting a competing PLC standard node grouping to operate during a period which is either less noisy or subject to a second type of noise.

According to another aspect of the present invention, a PLC device supports a powerline architecture with a supplemental ACK/NACK channel. In PLC communication systems and other systems, losing an ACK is a big problem. Thus, according to the present invention, for ACK/NACK resilience, provide same on a supplemental channel which may be an alternate powerline conductor pathway or span entirely outside thereof into wire line, coax, over air, etc. This can be extended to cover situations with multi-casting (e.g., media streaming) to several devices and wherein ACK/NACK processing and subsequent resends can be handled outside of the main payload delivery. A secondary or redundant ACK/NACK may be transmitted through a second/differing frequency channel of a PLC, i.e., through narrowband when the main communications is through a broadband link.

According to aspects of the present invention, a PLC device will support at least one other communication path/type, using a differing medium, e.g., coax, wireless, Ethernet, etc. Thus, according to another aspect of the present invention, a redundancy approach is implemented by transmitting ACKs/NACKs across multiple available PHYs with one being PLC, transparently. For example, a pair of end-point devices has both PLC and WiFi interfaces. In each outgoing payload pathway, transmissions flow using PLC. However, in order to provide robust performance, ACKs and/or NACKs are transmitted back via both PLC and WiFi. Alternately, payloads may flow via WiFi with ACKs/NACKs flowing via both PLC and WiFi.

Figure 15:
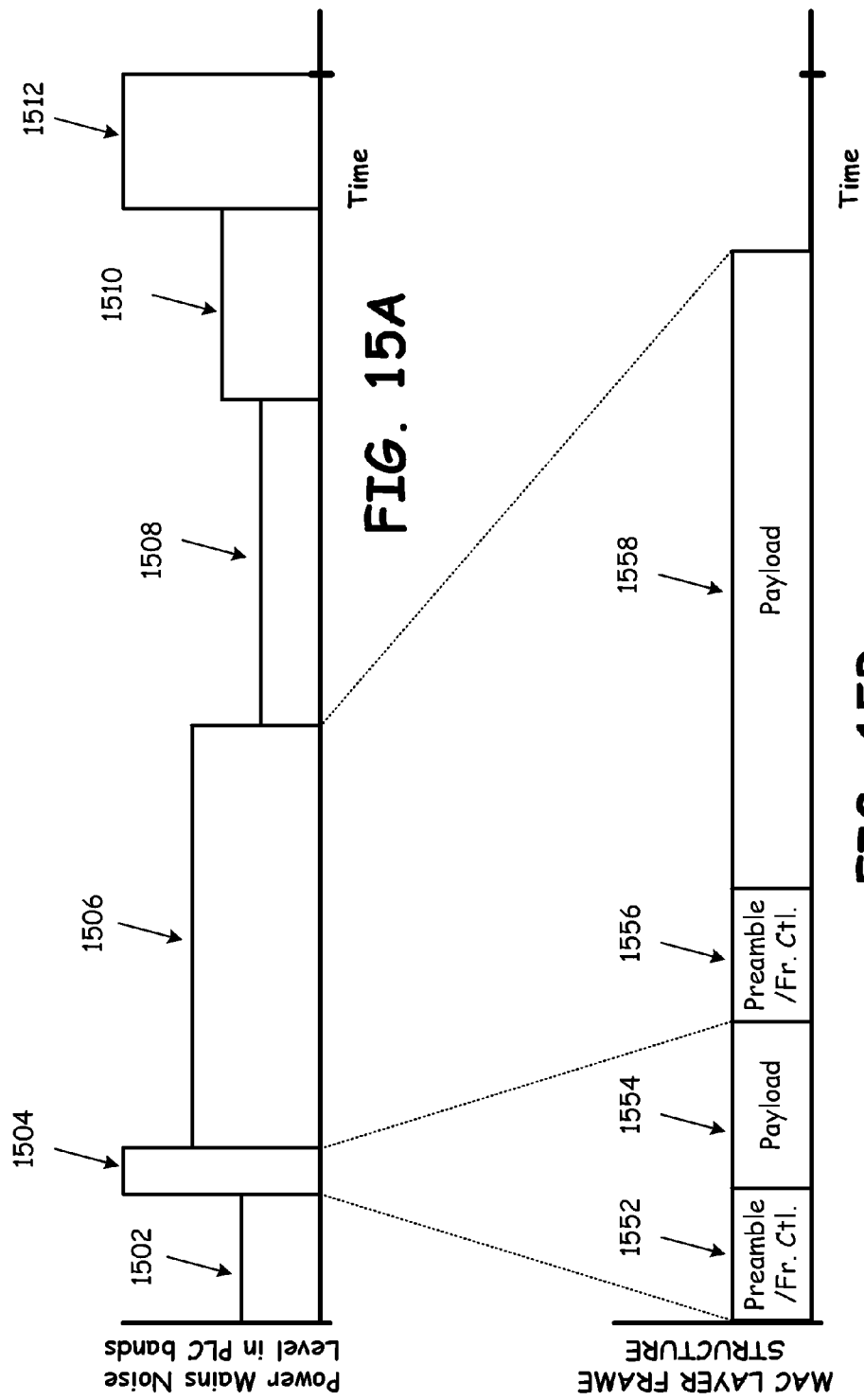
FIGS. 15A and 15B illustrate power mains noise in PLC bands for a power mains media and how MAC layer frame structures may be constructed to address such power mains noise, respectively.

The reader will appreciate that the noise cycle may be segregated in many different ways, in addition to the greater noise and lesser noise segregation of FIG. 5B. For example, FIG. 15A shows how the noise cycle may be segregated into many differing portions, each of which has its own consistent noise/SNR/impedance characteristic. The reader should also understand that while first and second or lesser and greater noise intervals are described herein, more than two noise intervals are also included in this basic characterization. The mixture of adjustments that the PLC device can do for the "first" and "second" periods include, for example adjustment of MAC frames, adjusting coding operation, adjusting Quality of Service operations, adjusting ACK operations, using different PLC standards, using differing communication operations, adjusting frame constructs, and adjusting frame durations.

Figure 6:
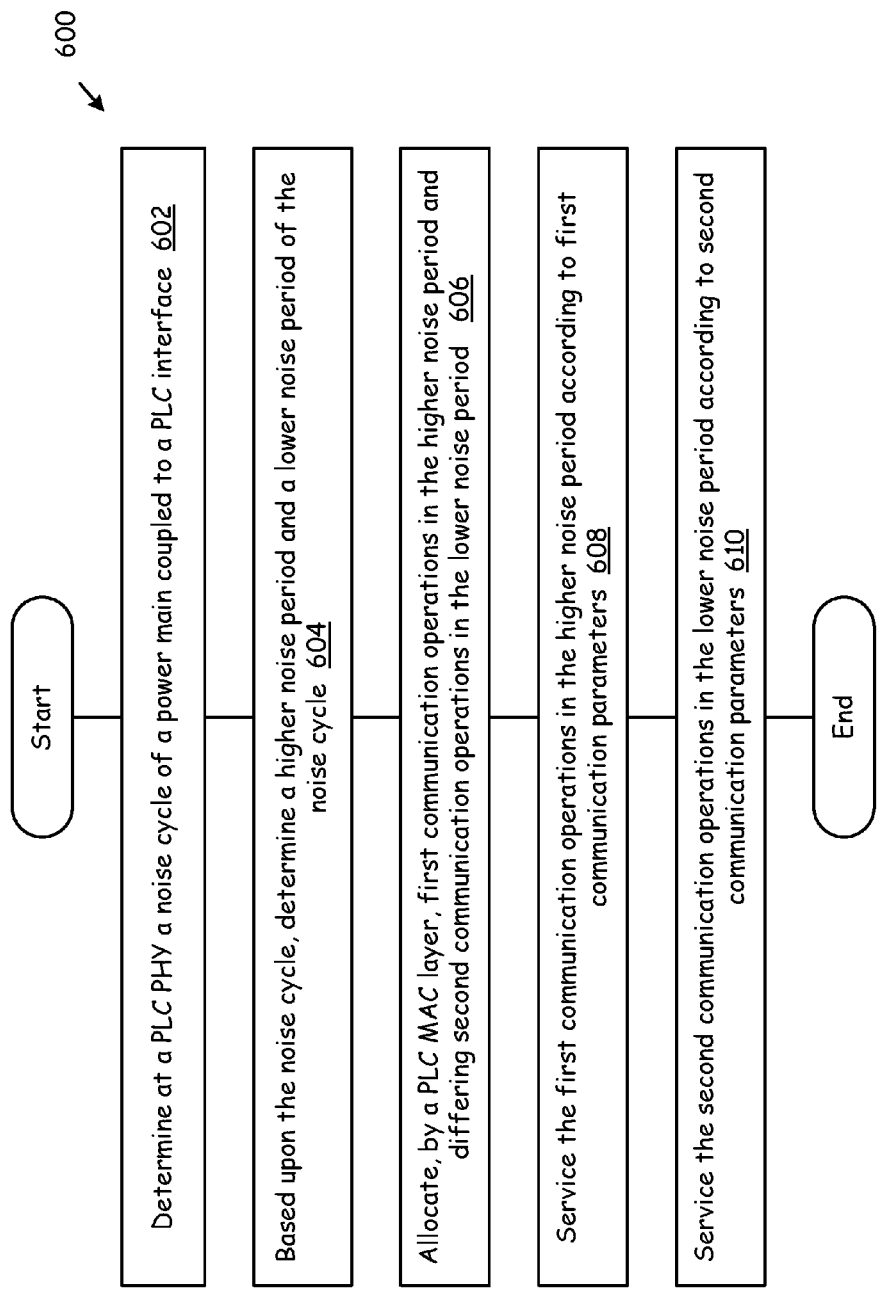
FIG. 6 is a flow chart illustrating operations according to one or more embodiments of the present invention.

FIG. 6 is a flow chart illustrating operations according to one or more embodiments of the present invention. Operations 600 commence with the a Power Line Communications (PLC) device determining, at a PLC Physical Layer (PHY), a noise cycle of a power main coupled to the PLC interface (Step 602). Operations 600 continue with the PLC device, based upon the noise cycle, determining a higher noise period and a lower noise period of the noise cycle (Step 604). Operations continue with the PLC device allocating, at a PLC Media Access Control (MAC) layer, first communication operations in the higher noise period and differing second communication operations in the lower noise period (Step 606).

Then, operations continue with the PLC device servicing the first communication operations in the higher noise period according to the first communication parameters (Step 608) and servicing the second communication operations in the lower noise period according to the second communication parameters (Step 610). From Step 610, operations end, although the operations 600 of FIG. 6 may be repeated periodically to account for frequency drift.

The operations 600 of FIG. 6 may be modified to accommodate non-cyclical noise events. In such case, upon detecting a noise event above a noise threshold, operations may be transitioned from the second communication parameters of the lower noise period to the first communication parameters of the first noise period.

Figure 7A:
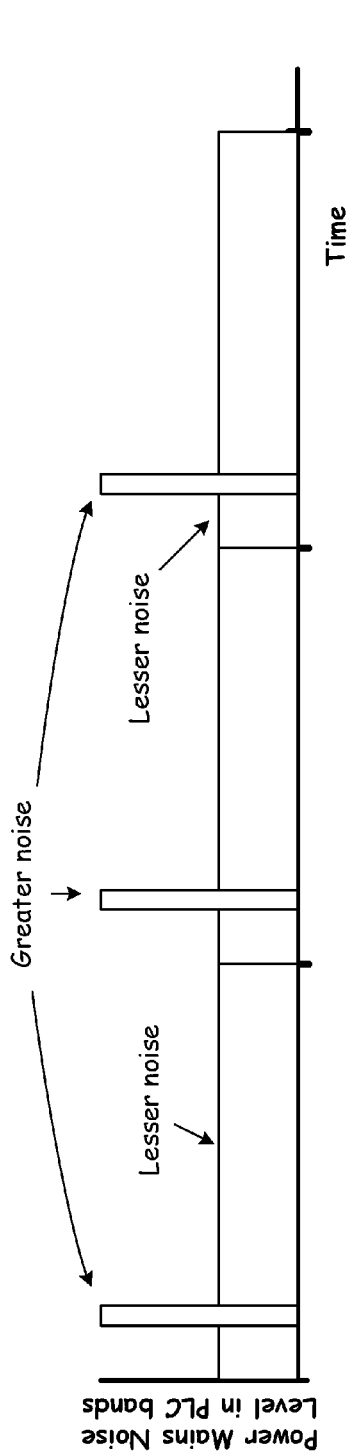
FIG. 7A is the graph previously illustrated in FIG. 5B showing noise levels of the noise cycle of FIG. 5A with which particular operations of embodiments of the present invention are described.
Figure 7B:
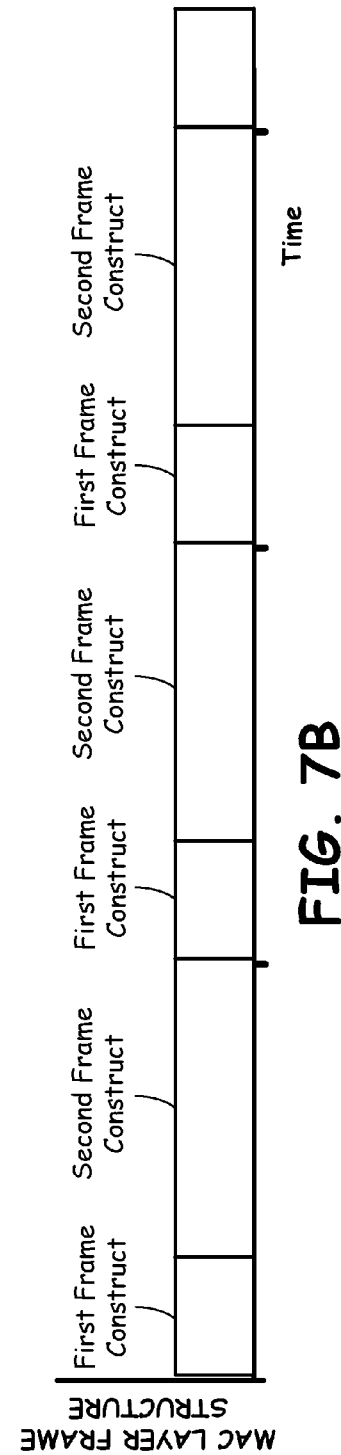
FIG. 7B is a graph illustrating differing frame constructs supporting communications according to one or more embodiments of the present invention.

FIG. 7A is the graph previously illustrated in FIG. 5B showing noise levels of the noise cycle of FIG. 5A with which particular operations of embodiments of the present invention are described. FIG. 7B is a graph illustrating differing frame constructs supporting communications according to one or more embodiments of the present invention. As shown in FIG. 7B, the processing module of the PLC device is operable to adjust framing of PLC MAC layer frames to have a first frame construct during the higher noise period and second frame construct during the lower noise period, wherein the first frame construct differs from the second frame construct. As shown, the first frames encompass the greater noise periods while the second frames construct fills in the time between the first frames.

Figure 8:
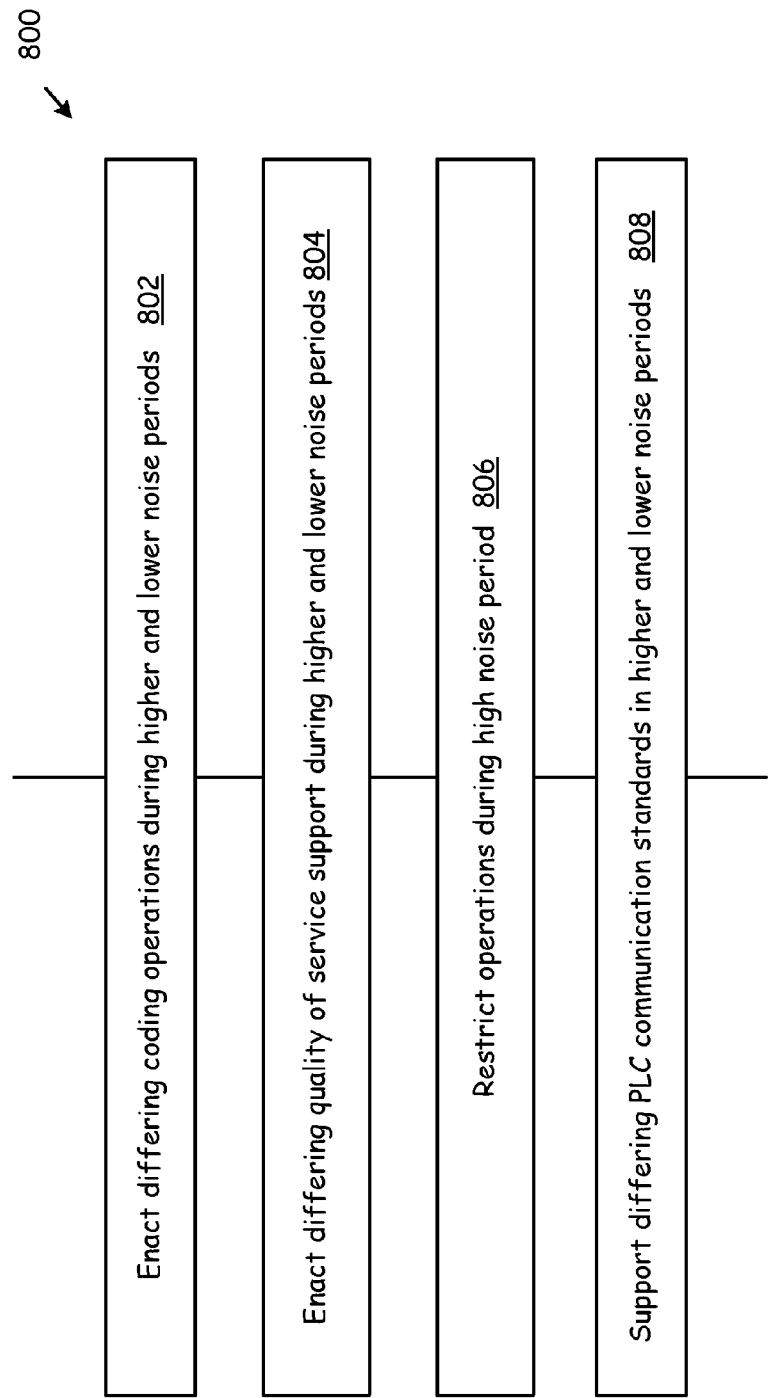
FIG. 8 is a flowchart illustrating operations according to one or more embodiments of the present invention for operating during differing portions of a noise cycle.

FIG. 8 is a flowchart illustrating operations according to one or more embodiments of the present invention for operating during differing portions of a noise cycle. According to various operations 800 for having differing communication operations may include enacting differing coding operations during the higher and lower noise periods (Step 802). In such case, first coding operations are enacted during the higher noise period and second coding operations are enacted during the lower noise period. Such coding operations may be one or both of block coding operations and channel coding operations.

According to another example of differing communication operations, the processing module is operable to adjust framing of PLC MAC layer frames to have first quality of service support during the higher noise period and second quality of service support during the lower noise period, wherein the second quality of service support is greater than the first quality of service support (Step 804). According to still another example of differing communication operations, the processing module is operable to restrict communications during the higher noise period (Step 806), and or to support differing PLC communication standards during the higher and lower noise periods (Step 808).

Figure 9:
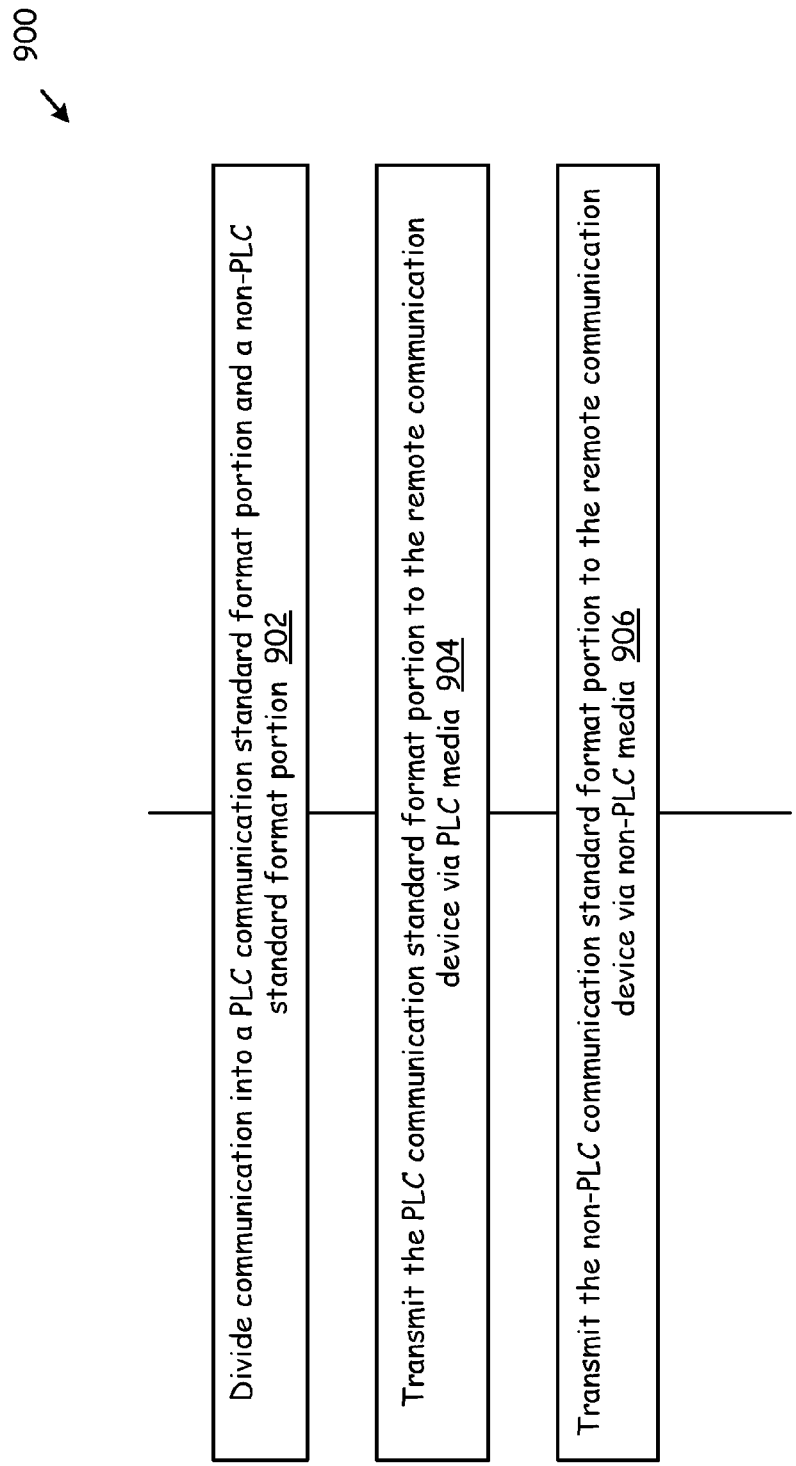
FIG. 9 is a flowchart illustrating operations according to one or more embodiments of the present invention for servicing communications using both PLC communication standard format communications and non-PLC communication standard format communications.

FIG. 9 is a flowchart illustrating operations according to one or more embodiments of the present invention for servicing communications using both PLC communication standard format communications and non-PLC communication standard format communications. Operations 900 commence with splitting a communication into a PLC communication standard format portion and a non-PLC communication standard format portion (Step 902). The non-PLC communication standard format may be one of those types previously described herein. Then, operation 900 continues with transmitting the PLC communication standard format portion to a remote communications device via PLC media (Step 904). Operations 900 continue with transmitting the non-PLC communication standard format portion to the remote communications device via non-PLC media (Step 906). The operations of steps 904 and 906 may be performed simultaneously such that communications transmitted on the PLC media and the non-PLC media occur simultaneously or sequentially, either step 904 or step 906 occurring first. The operations 900 of FIG. 9 may be performed when the PLC media is noisy so as to guarantee throughput between devices.

Figure 10:
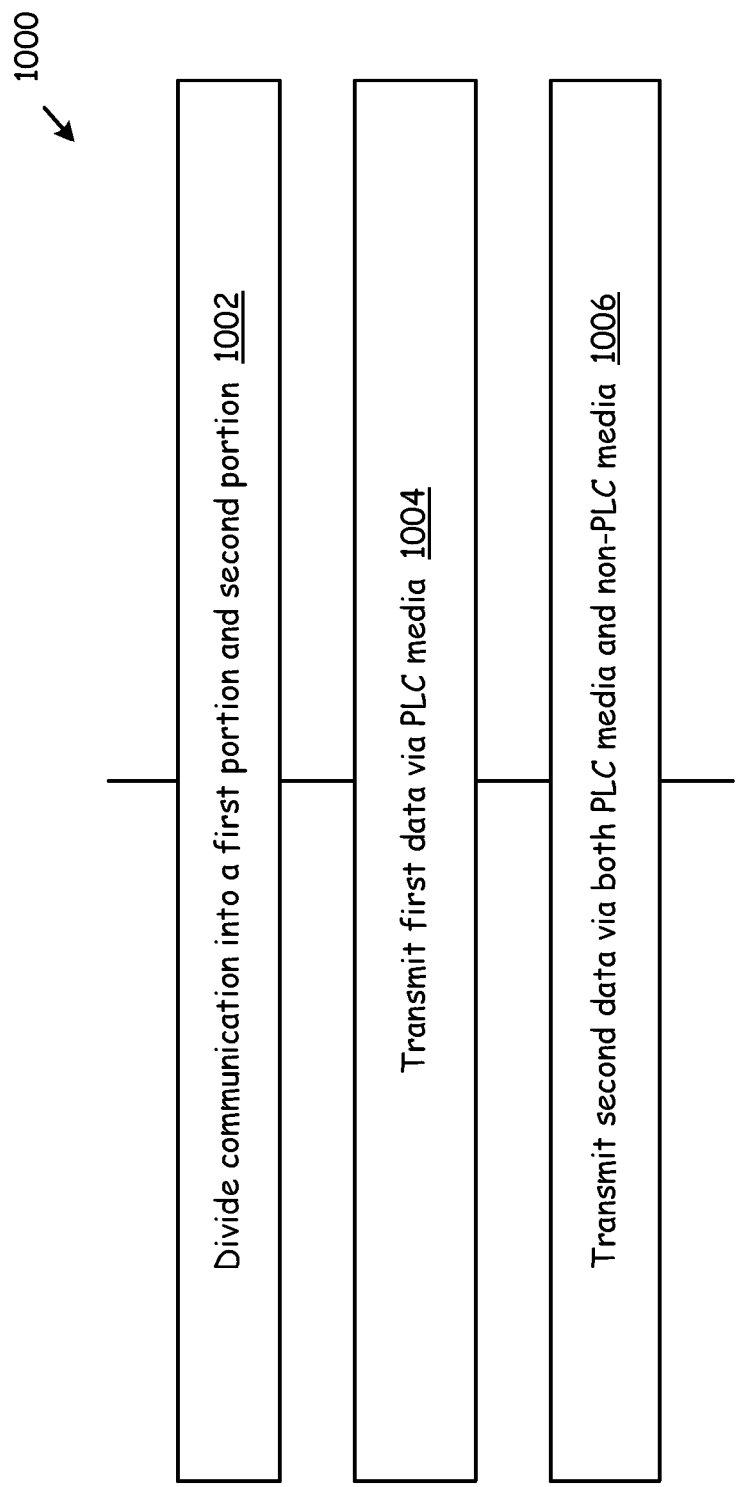
FIG. 10 is a flowchart illustrating operations according to one or more embodiments of the present invention for concurrently using PLC and non-PLC communications to service a single communication.

FIG. 10 is a flowchart illustrating operations according to one or more embodiments of the present invention for concurrently using PLC and non-PLC communications to service a single communication. Operations 1000 commence with dividing a communication into a first portion and a second portion (Step 1002). Then, operation 1000 continues with transmitting the first data via PLC media (Step 1004). Operation 1000 continues with transmitting the second portion via both the PLC media and the non-PLC media (Step 1006). The operations 1000 of FIG. 10 may be performed when the PLC media is noisy so as to guarantee throughput between devices.

Figure 11:
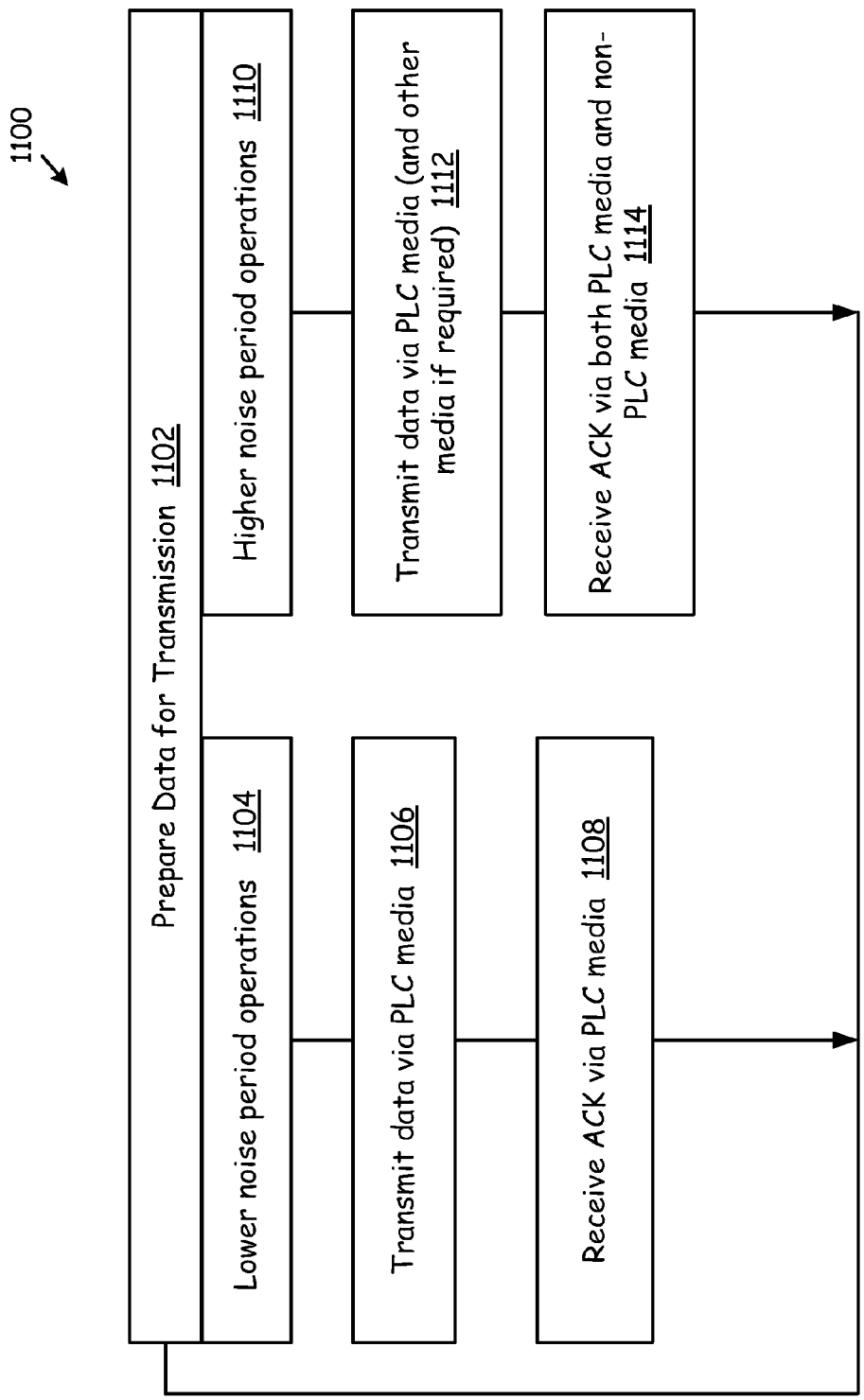
FIG. 11 is a flowchart illustrating operations according to one or more embodiments of the present invention supporting differing Acknowledgement (ACK) operations during differing portions of a noise cycle.

FIG. 11 is a flowchart illustrating operations according to one or more embodiments of the present invention supporting differing Acknowledgement (ACK) operations during differing portions of a noise cycle. The operations 1100 of FIG. 11 commence with the PLC device preparing for the transmission of data (Step 1102). For lower noise period operations (Step 1104), the PLC device transmits data via the PLC media (Step 1106) and only receives ACKs via the PLC media (1108). However, in higher noise period operations (Step 1110), the PLC device transmits data via the PLC media (and other media if required) (Step 1112), and listens for ACKs on both the PLC media and the non-PLC media, via respective interfaces (Step 1114). With the operations of Step 1114, the ACK operations span across multiple conductor pairs.

Figure 12:
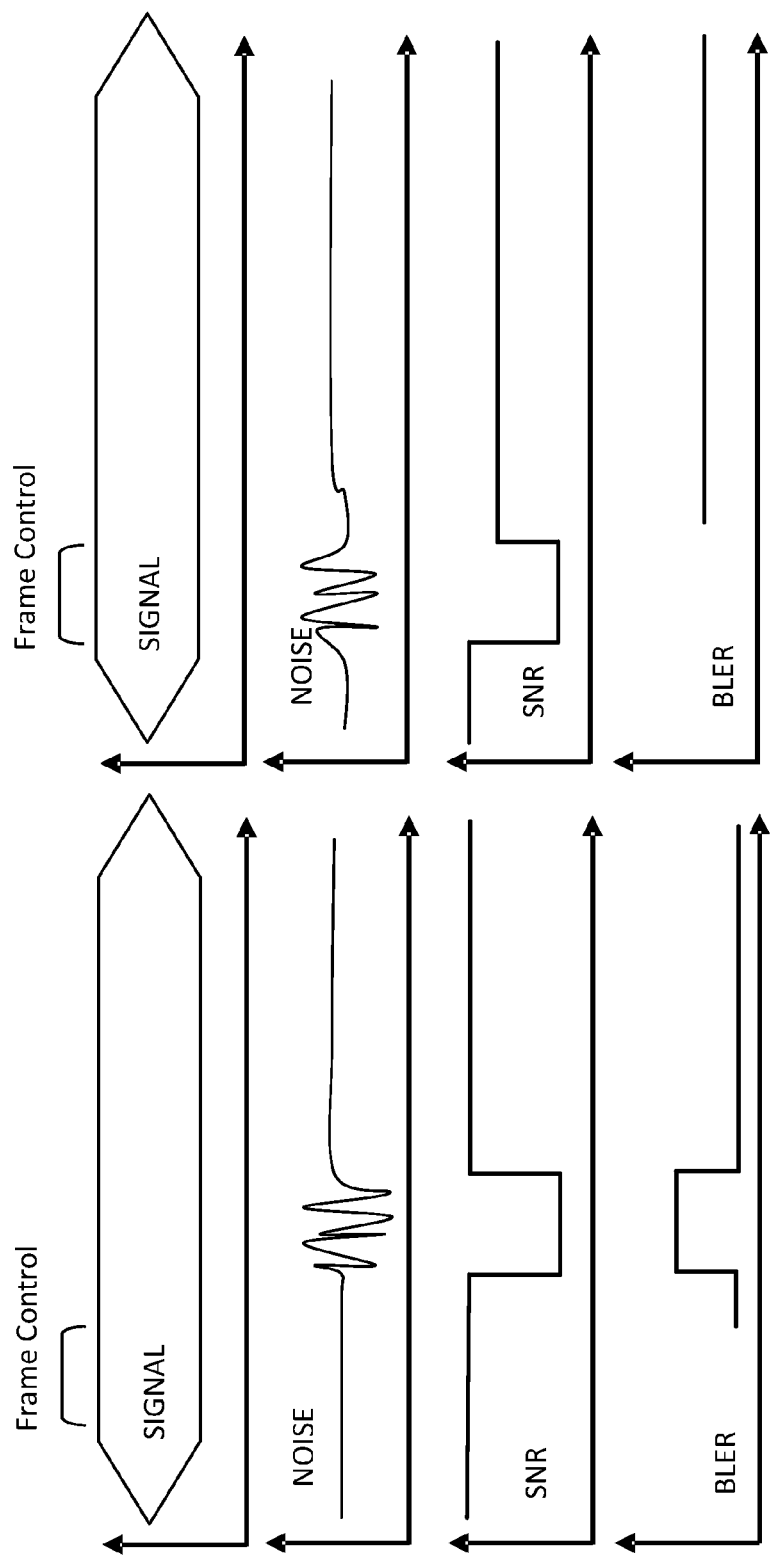
FIG. 12 illustrates various noise cycles and MAC frame alignments with indications how the noise affects signal quality and error rates.

FIG. 12 illustrates various noise cycles and MAC frame alignments with indications of how changes in the noise/impedance on the PLC media affects signal quality and error rates. As is known, a frame, e.g., MAC frame, consists of at least:

a Preamble: Used to synchronize and to perform channel estimation and weighting used in the frame control receipt/decoding. With a duration of 51.20 us in some PLC implementations Frame Control: Carries the data's header of the frames, and used to perform the channel estimation used in the equalization in the payload. With a duration of 59.28 us in some PLC implementations.

a Payload: Carries the frame's data. With a variable duration.

As is known, channel estimation is based upon a training sequence in the preamble and/or frame control that is used to estimate the channel of the media, e.g., PLC media with the channel estimate used to equalize the channel to cancel the effects of the channel. This operation assumes that the channel estimated during the frame control is the same as it is for the payload. In many communication systems, this assumption is generally true. However, in PLC systems, this assumption is often erroneous due to the presence of periodic noise and/or impedance changes.

If the frame control is transmitted during a low noise/non-impedance change portion of the PLC media and noise is present during the payload, SNR will suffer and the Block Error Rate (BLER) will increase during the payload when the noise event occurs, as is illustrated in the left portion of FIG. 12. Further, if the frame control is transmitted over an impedance change or a noisy slot of time, the SNR of this frame control will be degraded, as is illustrated in the right portion of FIG. 12. Resultantly, the rate at which data is transmitted in the payload is decreased to a level below which the channel supports. Further, because the channel estimate is incorrect for the PLC media during the payload the BLER is slightly higher than it would be if the channel were correctly characterized.

Figure 13:
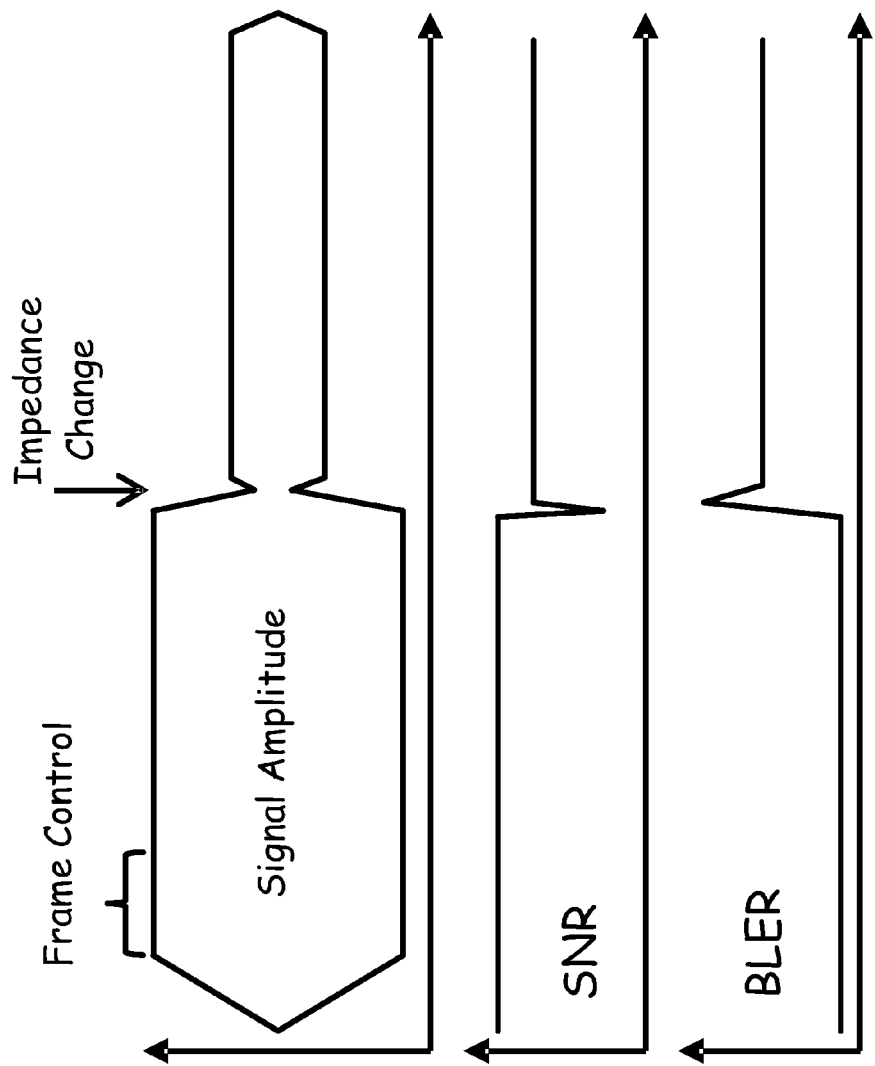
FIG. 13 illustrates how a change in noise level/impedance during a MAC frame affects signal quality and error rates.

FIG. 13 illustrates how a change in noise level/impedance during a MAC frame affects signal quality and error rates. As shown, an impedance change in the PLC media, which may be caused periodically or otherwise by a device coupled to the PLC media also affects PLC communications. With the example of FIG. 13, an impedance change occurs during the payload, causing signal amplitude of the PLC communication signal to decrease after the impedance change. In such case, the SNR of the channel decreases and the BLER of the PLC signal increase after the impedance change.

Figure 14:
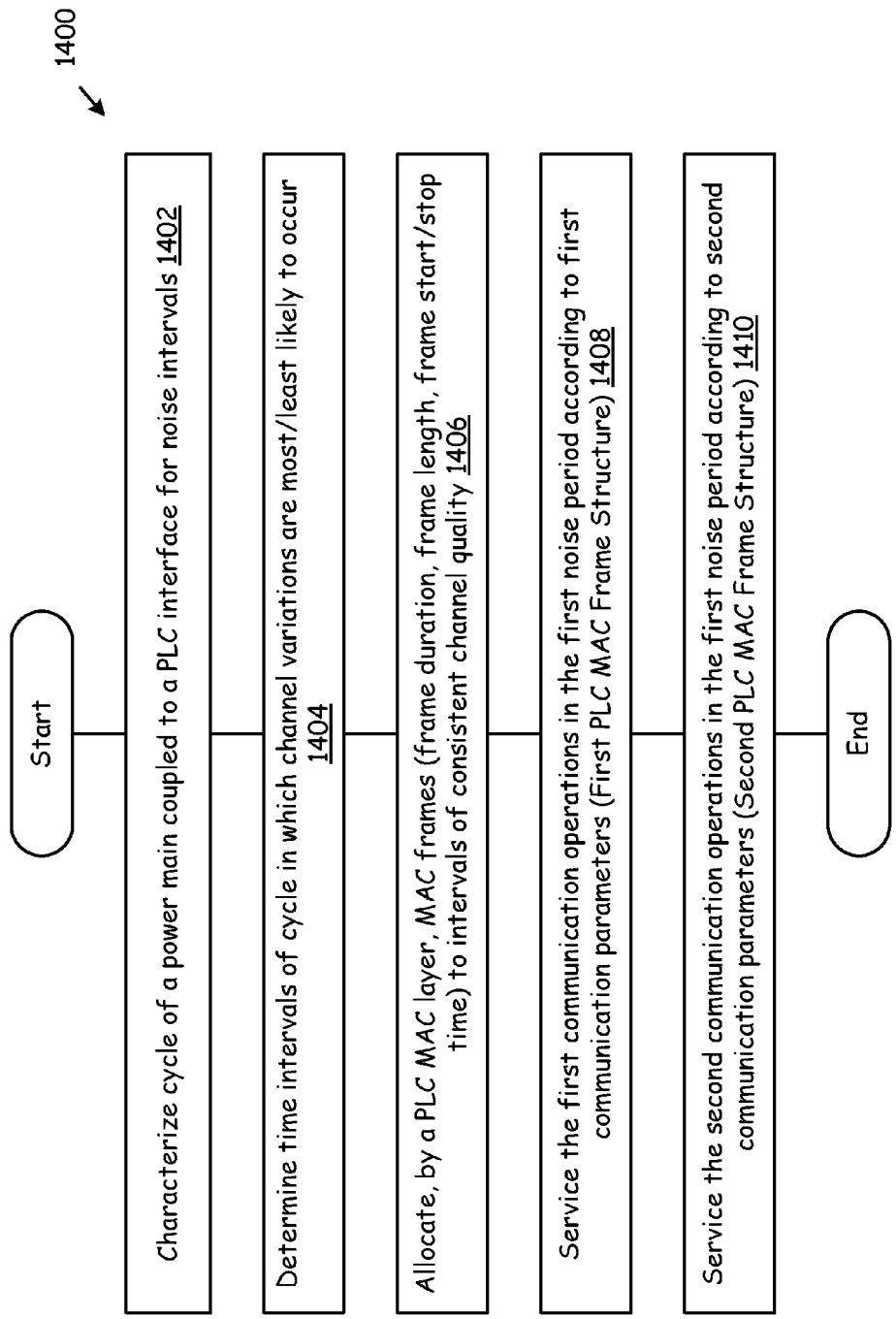
FIG. 14 is a flowchart illustrating operations according to one or more embodiments of the present invention for altering MAC frame structure and alignment based upon noise present upon a power mains media.

FIG. 14 is a flowchart illustrating operations according to one or more embodiments of the present invention for altering MAC frame structure and alignment based upon noise present upon a power mains media. Operations 1400 commence with the Power Line Communications (PLC) device characterizing a noise cycle (and or impedance cycle as seen by the PLC device) of a power main coupled to the PLC interface (Step 1402). Operations 1400 continue with the PLC device, based upon the noise cycle, determining time intervals of a cycle in which channel variation on the PLC media are most/least likely to occur, e.g., a higher noise period and a lower noise period of the noise cycle or impedance characterization differentiation (Step 1404).

Operations continue with the PLC device allocating, at a PLC Media Access Control (MAC) layer level, MAC frames to intervals of the noise/impedance cycle that are consistent with the channel quality/impedance characteristics over time (Step 1406). The operations of Step 1406 include establishing frame durations, frame lengths, frame start/stop times, frame payload coding characteristics, and other MAC frame characteristics for the particular characteristics of the PLC media at particular times. These operations of Step 1406 may include having differing MAC frames for differing times of the noise cycle/impedance cycle. The mixture of adjustments that the PLC device can do for the "first" and "second" periods (or more than two periods) include, for example adjustment of MAC frames, adjusting coding operation, adjusting Quality of Service operations, adjusting ACK operations, using different PLC standards, using differing communication operations, adjusting frame constructs, and adjusting frame durations. Generally, these operations may be referred to as End-Of-Interval "EOI" adaptations that Identify noisier and impedance change regions and splits the line intervals so that the noise and impedance effects on block error rate (BLER) are minimized. As is described herein such splitting consists on both a time division and a modification of time divisions to obtain maximum efficiency and minimum BLER from MAC.

Then, operations continue with the PLC device servicing the first communication operations in the first noise period/first impedance period according to the first communication parameters with the first PLC MAC frame structure (Step 1408) and servicing the second communication operations in the second noise period/second impedance period according to the second communication parameters with the second PLC MAC frame structure (Step 1410). Generally, the first and second noise/impedance periods have differing PLC media channel characteristics, as were previously described with reference to FIGS. 12 and 13 and as will be described with reference to FIGS. 15 and 16. From Step 1410, operations end, although the operations 1400 of FIG. 14 may be repeated.

FIGS. 15A and 15B illustrate power mains noise in PLC bands for a power mains media and how MAC layer frame structures may be constructed to address such power mains noise, respectively. As is shown particularly in FIG. 15A, differing noise levels may be present in differing portions of the PLC noise cycle, 1502-1512. Each of these intervals 1502-1512 is shown as having a differing noise level, e.g., differing available SNR with differing durations for each. While a typical PLC media may not have this type of noise/impedance signature, FIG. 15A provides a basis for describing various aspects of embodiments of the present invention.

Referring now to FIG. 15B, two differing PLC MAC frame structures are shown. In particular, a first PLC MAC frame structure includes a preamble/frame control 1552 and payload 1554. The preamble/frame control 1552 and payload 1554 of a first PLC MAC frame are constructed to correspond to time duration 1504 of the PLC channel. Likewise, a second PLC MAC frame structure includes a preamble/frame control 1556 and payload 1558 that corresponds to time duration 1506 of the PLC channel. Note that the duration of payloads 1554 and 1558 differ in duration and/or length. Such is the case because the PLC channel during intervals 1504 and 1506 differ and the differing PLC MAC frames are formed consistently therewith.

The noise cycle can be different for different nodes, as noise is a receiver dominated effect. Adaptation of the MAC according to aspects of the present invention may be performed for multiple receiver characteristics. Further, the impedance change may affect the transmitter. Thus, with some embodiments of the present invention, MAC layer frames may be broadcast/multicast across differing protocols and operations for adapting transmitter and receiver operations may be different.

Figure 16:
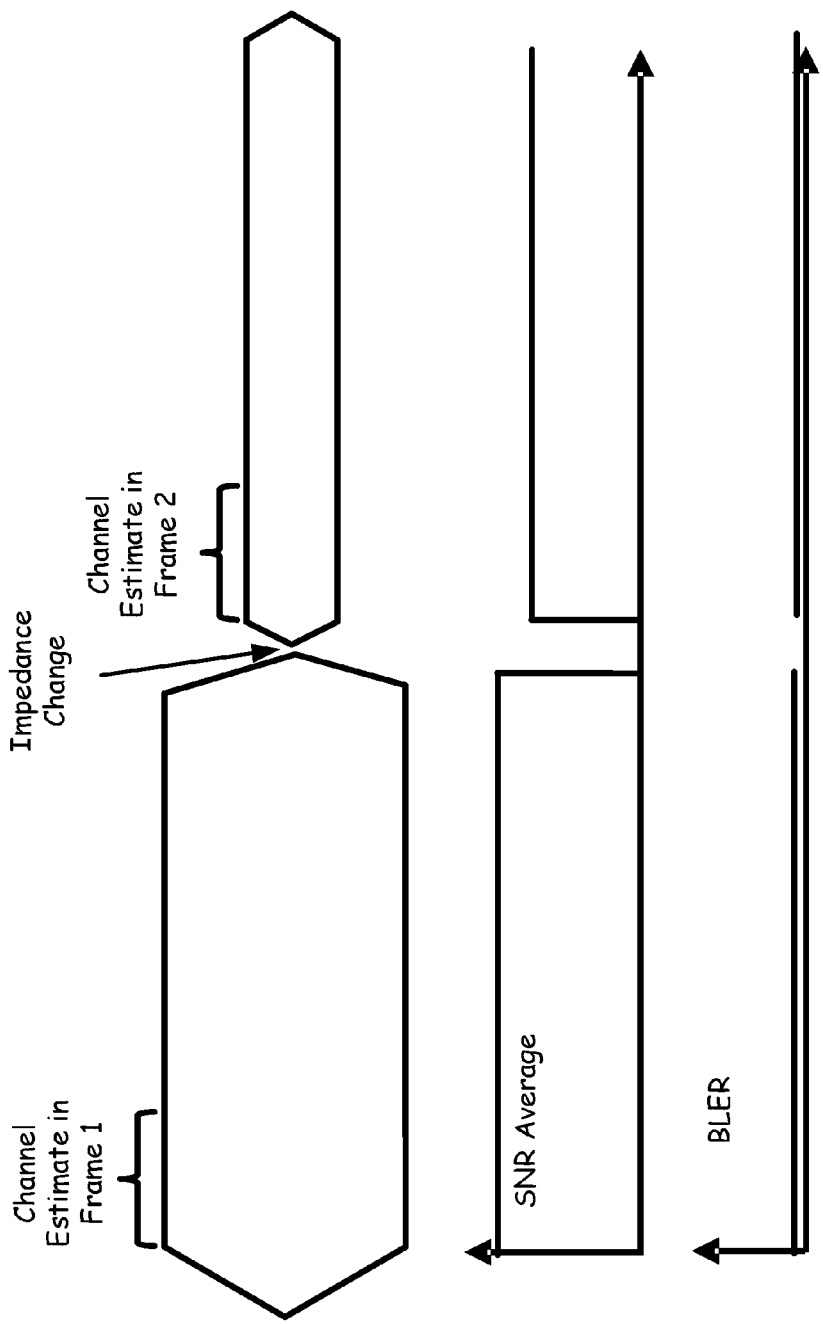
FIG. 16 illustrates how altering MAC frame structure and alignment according to one or more embodiments of the present invention improves system performance.

FIG. 16 illustrates how altering MAC frame structure and alignment according to one or more embodiments of the present invention improves system performance. As shown, when a first MAC PLC frame is completed prior to an impedance change, the first channel estimate performed prior to the impedance change is valid throughout the first payload. Further, with a second channel estimate performed after the impedance change, the second channel estimate is valid throughout the second payload. This minimizes BLER for each payload. By applying the teachings of the present invention, the PLC MAC frames may be tailored to the particular PLC media channel conditions to enhance performance during all of the noise/impedance cycles.

Circuitry described herein that performs particular functions may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions, which may be considered singularly or in combination a "processing module." The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributed located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry including the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the FIGs. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention.

The invention claimed is:

1. A Power Line Communications (PLC) device comprising:
   a processing module; and
   a PLC interface coupled to the processing module, wherein the processing module and the PLC interface are operable to:

determine, at a PLC Physical Layer (PHY), a periodic noise cycle of a power main coupled to the PLC interface;

based upon the periodic noise cycle, determine a periodic higher noise period and a periodic lower noise period of the periodic noise cycle; and allocate, by a PLC Media Access Control (MAC) layer, first communication operations in the periodic higher noise period and differing second communication operations in the periodic lower noise period, wherein Acknowledgement (ACK) operations during the periodic higher noise period differ from ACK operations during the lower noise period.

2. The PLC device of claim 1, wherein the processing module is operable to adjust framing of PLC MAC layer frames to have a first frame construct during the periodic higher noise period and second frame construct during the periodic lower noise period, wherein the first frame construct differs from the second frame construct.

3. The PLC device of claim 1, wherein the processing module is operable to enact first coding operations for the periodic higher noise period and to enact second coding operations for the periodic lower noise period.

4. The PLC device of claim 3, wherein the coding operations comprise at least one of block coding operations and channel coding operations.

5. The PLC device of claim 1, wherein the processing module is operable to adjust framing of PLC MAC layer frames to have first quality of service support during the periodic higher noise period and second quality of service support during the periodic lower noise period, wherein the second quality of service support is greater than the first quality of service support.

6. The PLC device of claim 1, wherein the processing module is operable to restrict communications during the periodic higher noise period.

7. The PLC device of claim 1, wherein:
the first communication operations in the periodic higher noise period comprise operations according to a first PLC communication standard; and
the second communication operations in the periodic lower noise period comprise operations according to a second PLC communication standard that differs from the first communication standard.

8. A method of operating a Power Line Communications (PLC) device comprising:
determining, at a PLC Physical Layer (PHY), a periodic noise cycle of a power main coupled to the PLC interface;
based upon the periodic noise cycle, determining a periodic higher noise period and a periodic lower noise period of the noise cycle;
allocating, by a PLC Media Access Control (MAC) layer, first communication operations in the periodic higher noise period and differing second communication operations in the periodic lower noise period; and
forming PLC MAC layer frames to have first quality of service support during the periodic higher noise period and second quality of service support during the periodic lower noise period, wherein the second quality of service support is greater than the first quality of service support.

9. The method of claim 8, further comprising adjusting framing of PLC MAC layer frames to have a first frame construct during the periodic higher noise period and a second frame construct during the periodic lower noise period, wherein the first frame construct differs from the second frame construct.

10. The method of claim 9, wherein:
the first frame construct has a first frame duration; and
the second frame construct has a second frame duration that differs from the first frame duration.

11. The method of claim 9, wherein:
the first frame construct has a first frame encoding; and
the second frame construct has a second frame encoding that differs from the first frame duration.

12. The method of claim 8, further comprising enacting first coding operations for the periodic higher noise period and to enact second coding operations for the periodic lower noise period.

13. The method of claim 12, wherein the coding operations comprise at least one of block coding operations and channel coding operations.

14. The method of claim 8, further comprising restricting communications during the higher noise period.

15. The method of claim 8, wherein Acknowledgement (ACK) operations during the periodic higher noise period differ from ACK operations during the periodic lower noise period.

16. The method of claim 15, wherein the ACK operations span across multiple conductor pairs.

17. The method of claim 8, wherein:
the first communication operations in the periodic higher noise period comprise operations according to a first PLC communication standard; and
the second communication operations in the periodic lower noise period comprise operations according to a second PLC communication standard that differs from the first communication standard.

18. A Power Line Communications (PLC) device comprising:
a processing module;
a PLC interface coupled to the processing module; and
a non-PLC interface coupled to the processing module, wherein the processing module, the PLC interface, and the non-PLC interface are operable to:
determine, at a PLC Physical Layer (PHY), a periodic noise cycle of a power main coupled to the PLC interface;
based upon the periodic noise cycle, determine a periodic higher noise period and a periodic lower noise period of the noise cycle; and
allocate, by a PLC Media Access Control (MAC) layer, first communication operations in the periodic higher noise period and differing second communication operations in the periodic lower noise period,
wherein the first communication operations comprise redundant data communications via both the PLC interface and the non-PLC interface; and
wherein the second communication operations comprise only PLC communications.

19. The PLC device of claim 18, wherein the first communication operations comprise Acknowledgement (ACK) operations that are redundantly serviced by both the PLC interface and the non-PLC interface.

20. A Power Line Communications (PLC) device comprising:
a processing module;
a PLC interface coupled to the processing module; and
a non-PLC interface coupled to the processing module, wherein the processing module, the PLC interface, and the non-PLC interface are operable to:

determine, at a PLC Physical Layer (PHY), a periodic noise cycle of a power main coupled to the PLC interface;

based upon the periodic noise cycle, determine a periodic higher noise period and a periodic lower noise period of the noise cycle; and allocate, by a PLC Media Access Control (MAC) layer, first communication operations in the periodic higher noise period and differing second communication operations in the periodic lower noise period, wherein the first communication operations include Acknowledgement (ACK) operations that are redundantly serviced by both the PLC interface and the non-PLC interface; and wherein the second communication operations comprise only PLC communications.

21. A Power Line Communications (PLC) device comprising:

a processing module; and a PLC interface coupled to the processing module, wherein the processing module and the PLC interface are operable to:

determine, at a PLC Physical Layer (PHY), a periodic noise cycle of a power main coupled to the PLC interface;

based upon the periodic noise cycle, determine a periodic higher noise period and a periodic lower noise period of the periodic noise cycle;

allocate, by a PLC Media Access Control (MAC) layer, first communication operations in the periodic higher noise period and differing second communication operations in the periodic lower noise period; and adjust framing of PLC MAC layer frames to have first quality of service support during the periodic higher noise period and second quality of service support during the periodic lower noise period, wherein the second quality of service support is greater than the first quality of service support.

22. A Power Line Communications (PLC) device comprising:

a processing module; and a PLC interface coupled to the processing module, wherein the processing module and the PLC interface are operable to:

determine, at a PLC Physical Layer (PHY), a periodic noise cycle of a power main coupled to the PLC interface;

based upon the periodic noise cycle, determine a periodic higher noise period and a periodic lower noise period of the periodic noise cycle; and allocate, by a PLC Media Access Control (MAC) layer:

first communication operations in the periodic higher noise period according to a first PLC communication standard; and second communication operations in the periodic lower noise period according to a second PLC communication standard that differs from the first communication standard.

23. A method of operating a Power Line Communications (PLC) device comprising:

determining, at a PLC Physical Layer (PHY), a periodic noise cycle of a power main coupled to the PLC interface;

based upon the periodic noise cycle, determining a periodic higher noise period and a periodic lower noise period of the noise cycle; and allocating, by a PLC Media Access Control (MAC) layer, first communication operations in the periodic higher noise period and differing second communication operations in the periodic lower noise period, wherein Acknowledgement (ACK) operations during the periodic higher noise period differ from ACK operations during the periodic lower noise period.

24. The method of claim 23, wherein the ACK operations span across multiple conductor pairs.

25. A method of operating a Power Line Communications (PLC) device comprising:

determining, at a PLC Physical Layer (PHY), a periodic noise cycle of a power main coupled to the PLC interface;

based upon the periodic noise cycle, determining a periodic higher noise period and a periodic lower noise period of the noise cycle; and allocating, by a PLC Media Access Control (MAC) layer, first communication operations according to a first PLC communication standard in the periodic higher noise period and second communication operations according to a second PLC communication standard that differs from the first communication standard in the periodic lower noise period.

* * * * *